United States Patent
Yu et al.

(10) Patent No.: US 11,251,799 B2
(45) Date of Patent: Feb. 15, 2022

(54) CONNECTION INTERFACE CIRCUIT, MEMORY STORAGE DEVICE AND PHASE-LOCKED LOOP CIRCUIT CALIBRATION METHOD

(71) Applicant: PHISON ELECTRONICS CORP., Miaoli (TW)

(72) Inventors: Chia-Hui Yu, Hsinchu County (TW); Wun-Jian Su, New Taipei (TW); Yu-Jung Chiu, Changhua County (TW); Chiao-Chieh Yang, Hsinchu (TW)

(73) Assignee: PHISON ELECTRONICS CORP., Miaoli (TW)

( * ) Notice: Subject to any disclaimer, the term of this patent is extended or adjusted under 35 U.S.C. 154(b) by 11 days.

(21) Appl. No.: 16/792,301

(22) Filed: Feb. 17, 2020

(65) Prior Publication Data
US 2021/0203334 A1 Jul. 1, 2021

(30) Foreign Application Priority Data
Dec. 25, 2019 (TW) .................................. 108147574

(51) Int. Cl.
*H03L 7/107* (2006.01)
*G06F 13/16* (2006.01)
*G11C 16/32* (2006.01)

(52) U.S. Cl.
CPC .......... *H03L 7/107* (2013.01); *G06F 13/1668* (2013.01); *G11C 16/32* (2013.01)

(58) Field of Classification Search
CPC ...... H03L 7/107; G06F 13/1668; G11C 16/32
See application file for complete search history.

(56) References Cited

U.S. PATENT DOCUMENTS

2010/0271092 A1* 10/2010 Zerbe ........................ G06F 1/04
327/161
2012/0025880 A1* 2/2012 Romano ................... H03L 7/08
327/156
(Continued)

FOREIGN PATENT DOCUMENTS

TW I663837 6/2019

OTHER PUBLICATIONS

Ali et al., A High Frequency, Low Jitter Auto-Calibration PLL with Built-in-Self-Test. '05 20th IEEE International Symposium on Defect and Fault Tolerance in VLSI Systems (DFT'05) [online][retrieved Apr. 23, 2021]. Retrieved from <URL:https://ieeexplore.ieee.org/stamp/stamp.jsp?tp=&arnumber=1544559 (Year: 2005).*
(Continued)

*Primary Examiner* — Eric T Oberly
(74) *Attorney, Agent, or Firm* — JCIPRNET

(57) ABSTRACT

A phase-locked loop circuit calibration method for a memory storage device including a rewritable non-volatile memory module is provided according to an exemplary embodiment of the disclosure. The method includes: receiving a first signal from a host system; generating a jitter signal by the memory storage device; generating a second signal according to the first signal and the jitter signal; performing a phase-lock operation on the second signal to generate a third signal by a phase-locked loop circuit; and calibrating an electrical parameter of the phase-locked loop circuit according to a variation of a time difference between the first signal and the third signal.

27 Claims, 8 Drawing Sheets

(56) References Cited

U.S. PATENT DOCUMENTS

2013/0257497 A1* 10/2013 Thelen .................. H03L 7/091
　　　　　　　　　　　　　　　　　　　　327/158
2016/0226443 A1* 8/2016 Caffee .................... H03B 5/12

OTHER PUBLICATIONS

Veillette et al., On-chip Measurement of the Jitter Transfer Function of Charge-Pump Phase-Locked Loops. Proceedings International Test Conference 1997 [online][retrieved Apr. 23, 2021]. Retrieved from <URL:https://ieeexplore.ieee.org/stamp/stamp.jsp?tp=&arnumber=639691 (Year: 1997).*

* cited by examiner

CONNECTION INTERFACE CIRCUIT, MEMORY STORAGE DEVICE AND PHASE-LOCKED LOOP CIRCUIT CALIBRATION METHOD

CROSS-REFERENCE TO RELATED APPLICATION

This application claims the priority benefit of Taiwan application serial no. 108147574, filed on Dec. 25, 2019. The entirety of the above-mentioned patent application is hereby incorporated by reference herein and made a part of this specification.

BACKGROUND

1. Technology Field

The disclosure relates to a calibration mechanism for a phase-locked loop (PLL) circuit, and more particularly, to a connection interface circuit, a memory storage device and a phase-locked loop circuit calibration method.

2. Description of Related Art

Phase-locked loops are widely used in the field of communications. In the phase-locked loop, a reference signal and an output signal may be locked at the same frequency and phase according to a feedback signal, so as to reduce a signal error generated at a receiver circuit due to a frequency offset of signal during the transmission process. In some applications, a loop bandwidth of the phase-locked loop needs to be controlled in a specific range. However, the loop bandwidth of the phase-locked loop can easily change correspondingly due to external environment (e.g., temperature), process errors or voltage changes, making it difficult to calibrate the loop bandwidth of the phase-locked loop. In addition, if the phase-locked loop is calibrated by detecting parameters like an eye width or an eye height of the signal output by the phase-locked loop, an additional chip is generally required to detect the eye width or the eye height, resulting in excessive circuit area and/or increased system power consumption.

SUMMARY

The disclosure provides a connection interface circuit, a memory storage device and a phase-locked loop circuit that can effectively calibrate an electrical parameter of the phase-locked loop.

An exemplary embodiment of the disclosure provides a connection interface circuit for connecting a memory storage device to a host system. The connection interface circuit includes a calibration circuit, a jitter generation circuit and a phase-locked loop circuit. The calibration circuit is configured to provide a jitter signal. The jitter generation circuit is configured to receive a first signal from the host system and generate a second signal according to the first signal and the jitter signal. The phase-locked loop circuit is coupled to the jitter generation circuit and the calibration circuit and configured to perform a phase-lock operation on the second signal to generate a third signal. The calibration circuit is further configured to calibrate an electrical parameter of the phase-locked loop circuit according to a variation of a time difference between the first signal and the third signal.

An exemplary embodiment of the disclosure further provides a memory storage device, which includes a connection interface unit, a rewritable non-volatile memory module and a memory control circuit unit. The connection interface unit is configured to couple to a host system. The memory control circuit unit is coupled to the connection interface unit and the rewritable non-volatile memory module. The connection interface unit includes a phase-locked loop circuit. The connection interface unit is configured to receive a first signal from the host system. The connection interface unit is further configured to generate a jitter signal. The connection interface unit is further configured to generate a second signal according to the first signal and the jitter signal. The phase-locked loop circuit is configured to perform a phase-lock operation on the second signal to generate a third signal. The connection interface unit is further configured to calibrate an electrical parameter of the phase-locked loop circuit according to a variation of a time difference between the first signal and the third signal.

An exemplary embodiment of the disclosure further provides a phase-locked loop circuit calibration method for a memory storage device including a rewritable non-volatile memory module. The phase-locked loop circuit calibration method includes: receiving a first signal from a host system; generating a jitter signal by the memory storage device; generating a second signal according to the first signal and the jitter signal; performing a phase-lock operation on the second signal to generate a third signal by a phase-locked loop circuit; and calibrating an electrical parameter of the phase-locked loop circuit according to a variation of a time difference between the first signal and the third signal.

Based on the above, after the first signal is received from the host system, the second signal may be generated according to the first signal and the jitter signal generated by the memory storage device. After the phase-lock operation is performed on the second signal to generate the third signal, the electrical parameter of the phase-locked loop circuit may be calibrated according to the variation of the time difference between the first signal and the third signal. In this way, the electrical parameter of the phase-locked loop circuit may be effectively calibrated without additional chips disposed for detecting the eye width and/or the eye height of the signal.

To make the aforementioned more comprehensible, several embodiments accompanied with drawings are described in detail as follows.

DESCRIPTION OF THE EMBODIMENTS

Embodiments are provided below to describe the present disclosure in detail, though the present disclosure is not limited to the provided embodiments, and the provided embodiments can be suitably combined. The term "coupling/coupled" used in this specification (including claims) may refer to any direct or indirect connection means. For example, "a first device is coupled to a second device" should be interpreted as "the first device is directly connected to the second device" or "the first device is indirectly connected to the second device through other devices or connection means." In addition, the term "signal" can mean a current, a voltage, a charge, a temperature, data or any one or multiple signals.

Figure 1:
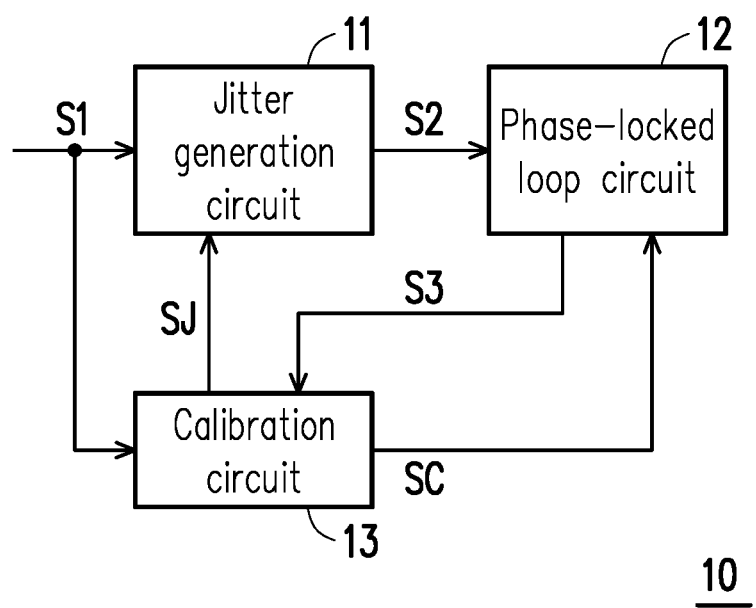
FIG. 1 is a schematic diagram illustrating a connection interface circuit according to an exemplary embodiment of the disclosure.

FIG. 1 is a schematic diagram illustrating a connection interface circuit according to an exemplary embodiment of the disclosure. Referring to FIG. 1, a connection interface circuit 10 includes a jitter generation circuit 11, a phase-locked loop circuit 12 and a calibration circuit 13. The calibration circuit 13 is coupled to the jitter generation circuit 11 and the phase-locked loop circuit 12.

The jitter generation circuit 11 may receive a signal (a.k.a. a first signal) S1 from a host system and a signal (a.k.a. a jitter signal) SL from the calibration circuit 13. In an exemplary embodiment, the signal S1 may be a differential signal or a non-differential signal. For example, the signal S1 may include two signals having the same amplitude but opposite phases. In an exemplary embodiment, the signal SJ may be regarded as artificial and/or intentionally created noise. For example, the signal SJ may be a sine wave, a square wave, a triangle wave, or a signal with a fixed period formed by combining the above basic waves. In an exemplary embodiment, a frequency (a.k.a. a clock frequency) of the signal SJ is not higher than a frequency of the signal S1. For example, the frequency of the signal SJ may be 3.5 MHz, and the frequency of the signal S1 may be 100 MHz. However, in another exemplary embodiment, the frequencies of the signals SJ and S1 may both be adjusted depending on actual requirements.

The jitter generation circuit 11 may generate a signal (a.k.a. a second signal) S2 according to the signal S1 and the signal SJ. Here, the jitter generation circuit 11 may adjust the signal S1 according to the signal SJ so that at least one rising edge or/and at least one falling edge of a bitstream of the signal S2 has a different amount of time offset. For example, the jitter generation circuit 11 may have the signal SJ reacted with the signal S1 to generate the signal S2 by using logic circuit elements such as an adder, an injector or a voltage controlled delay circuit. In other words, the frequency, amplitude, period or other electrical parameters of the signal S1 may be randomly changed by having the signal SJ reacted with the signal S1.

The phase-locked loop circuit 12 may receive the signal S2 from the jitter generation circuit 11. The phase-locked loop circuit 12 may perform a phase-lock operation on the signal S2 to generate a signal (a.k.a. a third signal) S3. For example, the phase-locked loop circuit 12 may be a feedback circuit, and the phase-locked loop circuit 12 may lock up the frequencies and phases of the signals S2 and S3. For example, through the phase-locked loop circuit 12, the frequency and phase of the signal S3 may approach the frequency and phase of the signal S2, respectively.

The calibration circuit 13 may be used to provide the signal SJ to the jitter generation circuit 11 and receive the signals S1 and S3 from the host system and the phase-locked loop circuit 12 respectively. The calibration circuit 13 may detect a time difference between the signals S1 and S3 and a variation of such time difference. The calibration circuit 13 may calibrate an electrical parameter of the phase-locked loop circuit 12 such as a loop bandwidth and/or a loop jitter peaking. For example, according to the variation of the time difference between the signals S1 and S3, the calibration circuit 13 may output a signal (a.k.a. a control signal) SC to the phase-locked loop circuit 12. The signal SC is used to instruct the phase-locked loop circuit 12 to use or adjust a specific circuit parameter. According to the signal SC, the phase-locked loop circuit 12 may automatically use or adjust the specific circuit parameter to calibrate the electrical parameter of the phase-locked loop circuit 12. In addition, the calibration circuit 13 may also adjust the frequency, amplitude, period or other electrical parameters of the signal SJ.

Figure 2:
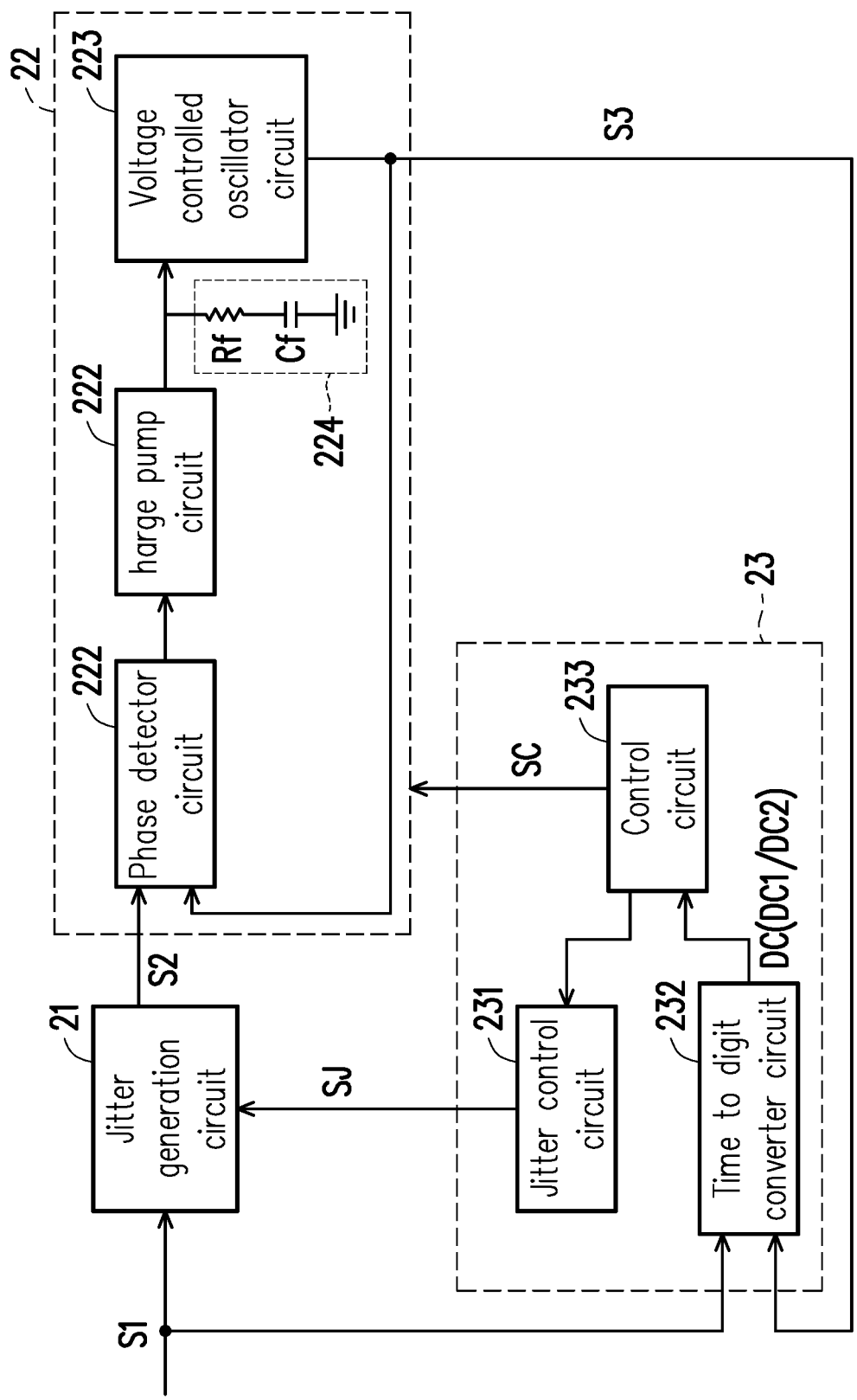
FIG. 2 is a schematic diagram illustrating a connection interface circuit according to another exemplary embodiment of the disclosure.

FIG. 2 is a schematic diagram illustrating a connection interface circuit according to another exemplary embodiment of the disclosure. Referring to FIG. 2, a connection interface circuit 20 includes a jitter generation circuit 21, a phase-locked loop circuit 22 and a calibration circuit 23. The jitter generation circuit 21 is identical or similar to the jitter generation circuit 11 in the exemplary embodiment of FIG. 1. For example, the jitter generation circuit 21 is configured to have the signal SJ reacted with the signal S1 so that at least one rising edge or/and at least one falling edge of a bitstream of the signal S2 has a different amount of time offset.

In an exemplary embodiment, the jitter generation circuit 21 may include one or more voltage controlled delay circuits. The voltage controlled delay circuit may be a delay line circuit and includes a plurality of delay elements. The voltage controlled delay circuit may receive the signal S1 and delay the signal S1 according to the signal SJ to output the delayed signal S1 (i.e., the signal S2). Accordingly, the signal SJ may be used to adjust the frequency, amplitude, period or other electrical parameters of the signal S1 (or the signal S2).

The phase-locked loop circuit 22 includes a phase detector (PD) circuit 221, a charge pump (CP) circuit 222, a voltage controlled oscillator (VCO) circuit 223 and a loop filter (LP) circuit 224. The charge pump circuit 222 is coupled to the phase detector circuit 221, the voltage controlled oscillator circuit 223 and the loop filter circuit 224. The phase detector circuit 221 is configured to compare the phases of the signal S2 and the signal S3. The charge pump circuit 222 is configured to output a signal Vout indicating boost or buck according to a comparison result of the phase detector circuit 221.

The loop filter circuit 224 is a loop filter circuit (LPF) and is configured to filter a high frequency noise of the signal Vout. For example, the loop filter circuit 224 may include a resistor Rf and a capacitor Cf. A first terminal of the resistor Rf receives the signal Vout. A second terminal of the resistor Rf is coupled to a first terminal of the capacitor Cf, and a second terminal of the capacitor Cf is coupled to a reference potential (e.g., grounded). It should be noted that in another exemplary embodiment, a circuit structure of the loop filter circuit 224 may be adjusted according to actual requirements.

The voltage controlled oscillator circuit 223 is configured to output the signal S3 according to the signal Vout, and the phase and/or frequency of the signal S3 is controlled by the signal Vout. For example, when a voltage of the signal Vout increases, the frequency of the signal S3 may increase. When the voltage of the signal Vout decreases, the frequency of the signal S3 may decrease. In addition, the voltage controlled oscillator circuit 223 may feed the signal S3 back to the phase detector circuit 221.

The calibration circuit 23 includes a jitter control circuit 231, a time to digital converter (TDC) circuit 232 and a control circuit 233. The control circuit 233 is coupled to the jitter control circuit 231 and the time to digit converter circuit 232. The jitter control circuit 231 is configured to provide the signal SJ to the jitter generation circuit 21. The control circuit 233 may instruct the jitter control circuit 231 to set or adjust the frequency, amplitude, period or other electrical parameters of the signal SJ.

The time to digit converter circuit 232 is configured to receive the signals S1 and S3 and detect a time difference between the signals S1 and S3 by comparing the signals S1 and S3. For example, the time difference may include a plurality of differences in time between a rising edge (or falling edge) of the signal S1 and a rising edge (or falling edge) of the signal S3 at different time points. For example, the time difference between the signals S2 and S3 may include a difference in time (a.k.a. a first time difference) between the rising edges of the signals S1 and S3 measured at one specific time point (a.k.a. a first time point) and a difference in time (a.k.a. a second time difference) between the rising edges of the signals S1 and S3 measured at another time point (a.k.a. a second time point). A value of the first time difference may be different from a value of the second time difference. The time to digit converter circuit 232 may generate a digital value DC according to a variation of the measured time differences.

In an exemplary embodiment, the digital value DC reflects a time offset range caused by the signal SJ on the signal S2 (or S3). For example, in response to the signal SJ, a rising edge (or falling edge) of the signal S3 may move within this time offset range.

In an exemplary embodiment, the time to digit converter circuit 232 may detect the differences in time between the rising edge (or falling edge) of the signal S1 and the rising edge (or falling edge) of the signal S3 at the different time points so as to define the time offset range. For example, in an exemplary embodiment, the time to digit converter circuit 232 may detect a maximum time difference (which may be a positive value) and a minimum time difference (which may be a negative value) between the signals S1 and S3. Then, the time to digit converter circuit 232 may determine the time offset range according to the maximum time difference and the minimum time difference.

Figure 3A:
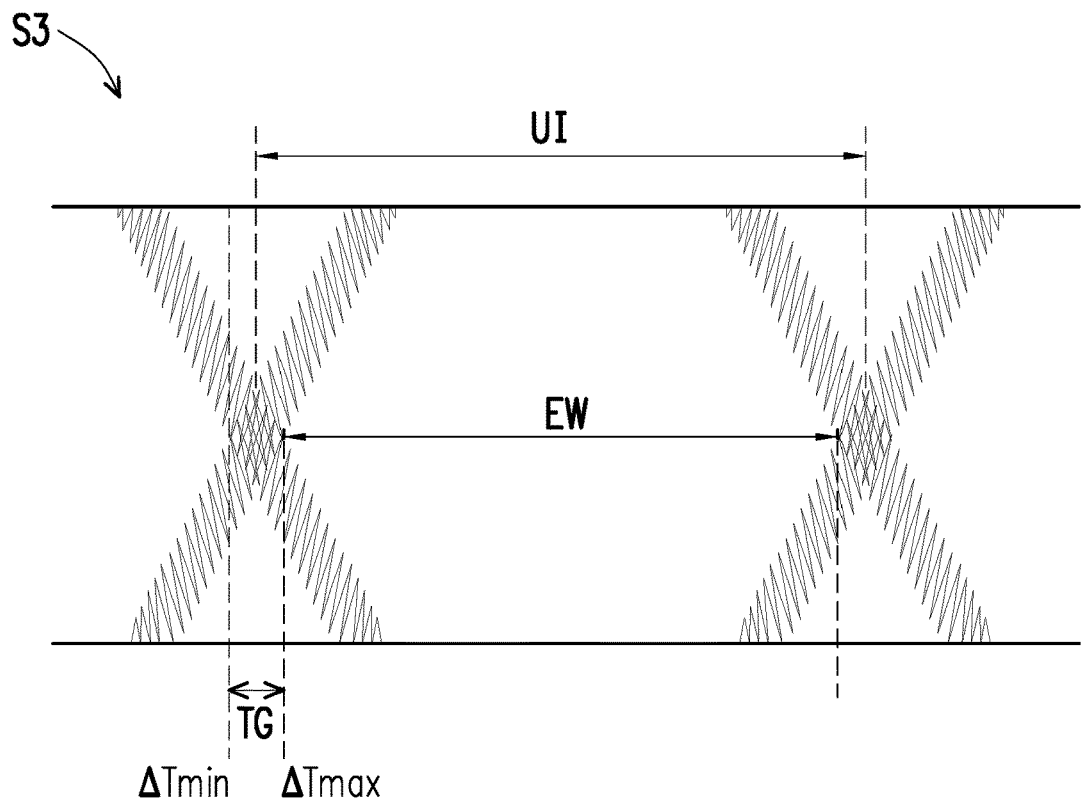
FIG. 3A is a schematic diagram illustrating a third signal and a time offset range according to an exemplary embodiment of the disclosure.
Figure 3B:
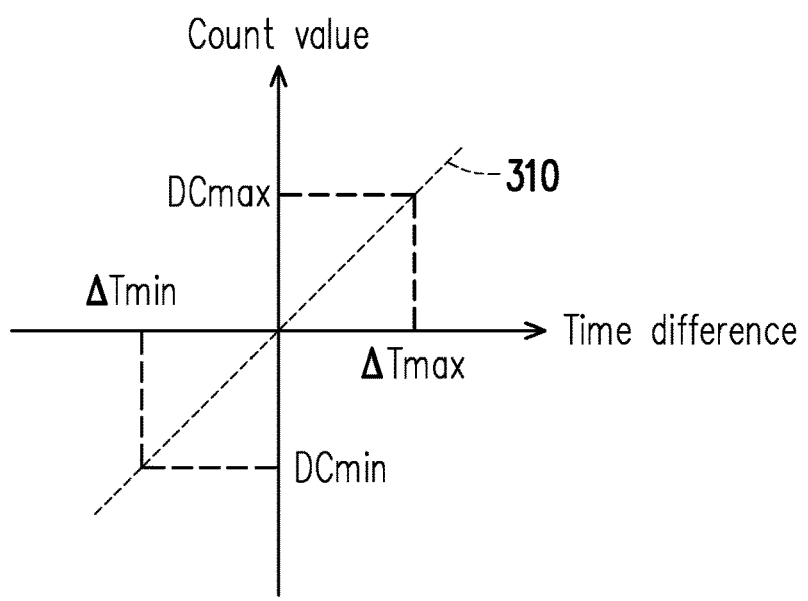
FIG. 3B is a schematic diagram illustrating a time difference and a corresponding count value according to an exemplary embodiment of the disclosure.
Figure 3C:
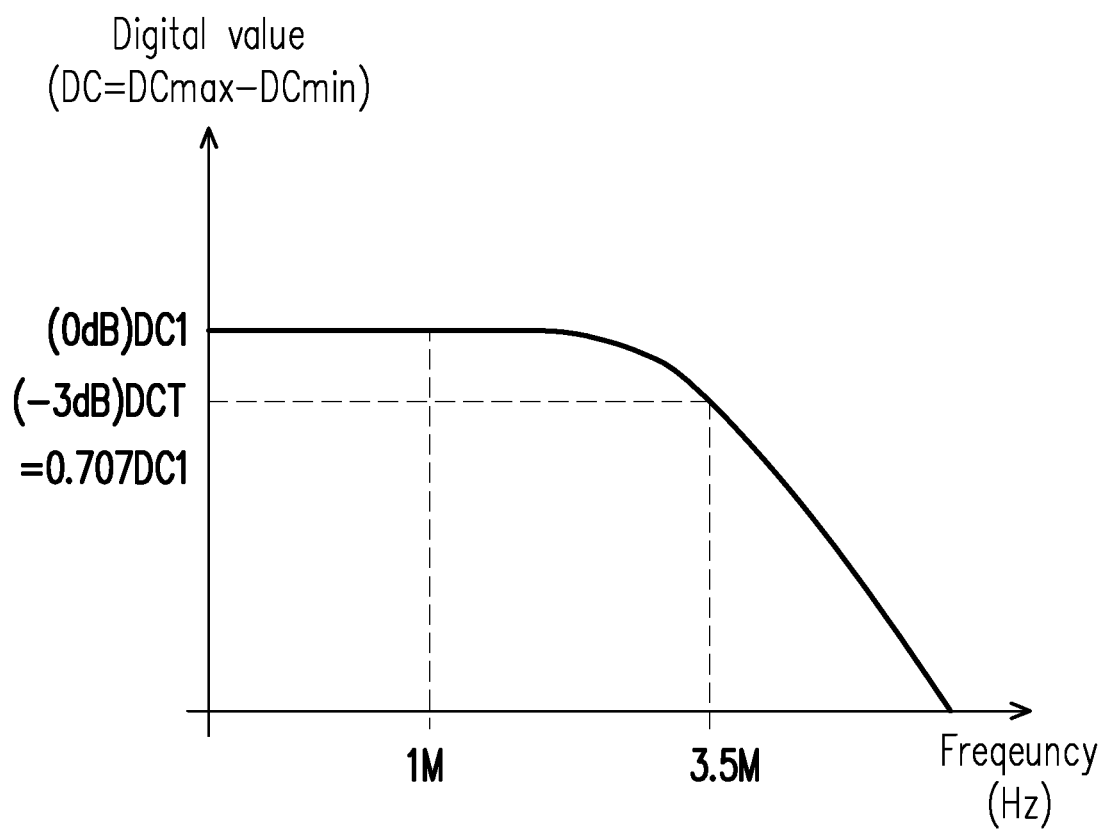
FIG. 3C illustrates a schematic diagram for evaluating performance of a phase-locked loop circuit according to an exemplary embodiment of the disclosure.

FIG. 3A is a schematic diagram illustrating a third signal and a time offset range according to an exemplary embodiment of the disclosure. FIG. 3B is a schematic diagram illustrating a time difference and a corresponding count value according to an exemplary embodiment of the disclosure. FIG. 3C illustrates a schematic diagram for evaluating performance of a phase-locked loop circuit according to an exemplary embodiment of the disclosure.

Referring to FIG. 3A, the signal S3 may be regarded as having a plurality of eyes. A width of the eye (i.e., an eye width) EW may be a pulse width UI minus a jitter value TG. In general, if the eye width EW of the signal S3 is wider and/or the eye height is wider, it is easier and more accurate to sample the signal S3. Conversely, if the eye width EW of the signal S3 is narrower and/or the eye height is narrower, it is more difficult and less accurate to sample of the signal S3.

In an exemplary embodiment, the jitter value TG may be used to indicate the time offset range caused by the signal SJ on the signal S2 (or S3). In an exemplary embodiment, it assumed that a junction of two eyes of the signal S3 almost overlaps with a junction of two eyes of the signal S1. Therefore, with the junction of the two eyes of the signal S3 as a reference, a left movement by ΔTmin in time is the minimum time difference between the signals S1 and S3. Similarly, with the junction of the two eyes of the signal S3 as the reference, a right movement by ΔTmax in time is the maximum time difference between the signals S1 and S3. A time range covered by the jitter value TG (i.e., the time offset range) may be equal to ΔTmin+ΔTmax.

Referring to FIG. 3B, according to a linear relation 310, count values DCmin and DCmax respectively corresponding to the time differences ΔTmin and ΔTmax may be obtained. A difference between the count values DCmin and DCmax may reflect a difference between the time differences ΔTmin and ΔTmax (i.e., the time offset range).

Referring back to FIG. 2, in an exemplary embodiment, the time to digit converter circuit 232 may detect the time differences ΔTmin and ΔTmax of FIG. 3A by comparing the signals S2 and S3. Then, the time to digit converter circuit 232 may obtain the count values DCmin and DCmax according to the linear relation 310 of FIG. 3B. Then, the time to digit converter circuit 232 may generate the digital value DC according to the difference between the count values DCmin and DCmax. The count value DC may reflect the difference between the count values DCmin and DCmax. For example, the time to digit converter circuit 232 may subtract the count value DCmin from the count value DCmax to obtain the digital value DC (i.e., DC=DCmax−DCmin).

The control circuit 233 may generate the signal SC according to the digital value DC to calibrate the electrical parameter of the phase-locked loop circuit 22. For example, according to the signal SC, at least one of a current, an impedance and a gain on a close loop path of the phase-locked loop circuit 22 may be adjusted. For example, the phase detector circuit 221, the charge pump circuit 222, the voltage controlled oscillator circuit 223 and the loop filter circuit 224 are all located on the close loop path of the phase detector circuit 22. Therefore, according to the signal SC, a gain (Kpd) of the phase detector circuit 221, a current (Icp) flowing through the charge pump circuit 222, an impedance of the loop filter circuit 224 and/or a gain (Kvco) of the voltage controlled oscillator circuit 223 may all be adjusted so as to calibrate the electrical parameter of the phase detector circuit 22 such as the loop bandwidth and/or the loop jitter peaking.

Referring to FIG. 2 and FIG. 3C, in an exemplary embodiment, the control circuit 233 may instruct the jitter control circuit 231 to set the frequency of the signal SJ to one specific frequency (a.k.a. a first frequency). For example, the first frequency may be 1 MHz and corresponding to a power 0 dB (i.e., a low frequency). According to the signal S1 and the signal SJ having the first frequency, the jitter generation circuit 21 may generate the signal S2. The phase-locked loop circuit 22 may perform the phase-lock operation on the signal S2 to generate the signal S3. The time to digit converter circuit 232 may compare the signals S2 and S3 to generate a digital value (a.k.a. a first digital value) DC1. The digital value DC1 may reflect the time offset range caused by the signal SJ on the signal S2 (or S3) at the low frequency.

After obtaining the digital value DC1, the control circuit 233 may determine a target value DCT according to the digital value DC1. For example, in correspondence to a power −3 dB (e.g., a target bandwidth), the control circuit 233 may multiple the digital value DC1 by 0.707 to obtain the target value DCT (i.e., DCT=0.707×DC1). Then, the control circuit 233 may change the frequency of the signal SJ. For example, the control circuit 233 may instruct the jitter control circuit 22 to set the frequency of the signal SJ to another frequency (a.k.a. a second frequency). For example, the second frequency may be 3.5 MHz (i.e., the target bandwidth). According to the signal S1 and the signal SJ having the second frequency, the jitter generation circuit 21 may generate the signal S2. The phase-locked loop circuit 22 may perform the phase-lock operation on the signal S2 to generate the signal S3. The time to digit converter circuit 232 may compare the signals S2 and S3 to generate another digital value (a.k.a. a second digital value) DC2. The digital value DC2 may reflect the time offset range caused by the signal SJ on the signal S2 (or S3) at a high frequency (or a target frequency). The control circuit 233 may generate the signal SC according to the target value DCT and the digital value DC2 to calibrate the electrical parameter of the phase-locked loop circuit 22.

With FIG. 3 as an example, if the digital value DC1 is 1000, the target value DCT may be 707. If the digital value DC2 is different from the target value DCT (e.g., 707), the control circuit 233 may calibrate the phase-locked loop circuit 22 through the signal SC. Then, the time to digit converter circuit 232 may compare the signals S2 and S3 again to re-generate DC2. If the digital value DC2 is still different from the target value DCT (e.g., 707), the control circuit 233 may calibrate the phase-locked loop circuit 22 through the signal SC again. In addition, if the digital value DC2 is identical (i.e., substantially identical) to the target value DCT (e.g., 707), the control circuit 233 may determine that the phase-locked loop circuit 22 is completely calibrated and stop calibrating the phase-locked loop circuit 22. It should be noted that, two values being substantially identical may be that they are completely identical or an allowable error exists between the two. Further, the method of setting the first frequency, the second frequency and the target value may be adjusted according to actual requirements, and the disclosure is not limited thereto.

In some exemplary embodiments, the connection interface circuits 10 and/or 20 may be disposed in the memory storage device to receive the signal S1 from the host system. However, in some other exemplary embodiments, the connection interface circuits 10 and/or 20 may also be disposed in other type of electronic device, and is not limited to the memory storage device.

Figure 4:
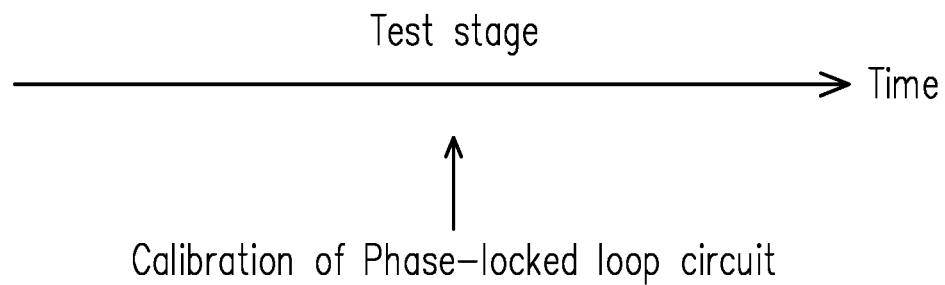
FIG. 4 and FIG. 5 are schematic diagrams illustrating the timing for calibrating the phase-locked loop circuit according to certain exemplary embodiments of the disclosure.
Figure 5:
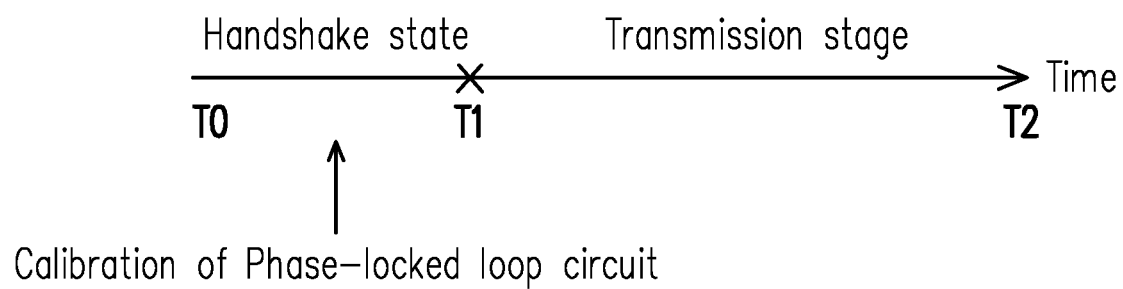

FIG. 4 and FIG. 5 are schematic diagrams illustrating the timing for calibrating the phase-locked loop circuit according to certain exemplary embodiments of the disclosure. In an exemplary embodiment, a calibration operation for the phase-locked loop circuits 12 and/or 22 may be executed in a test stage of the memory storage device, as shown by FIG. 4. For example, this test stage may be before the memory storage device is shipped from the factory or during maintenance. In the exemplary embodiment of FIG. 4, the host system is, for example, a test host, and the signal S1 is, for example, a test signal for calibrating the phase-locked loop circuits 12 and/or 22 in the test stage.

In an exemplary embodiment, the calibration operation for the phase-locked loop circuits 12 and/or 22 may be executed in a handshake stage between the memory storage device and the host system (i.e., between time points T0 and T1), as shown by FIG. 5. In this handshake stage, an initial signal (a.k.a. a handshake signal) is transmitted between the memory storage device and the host system to establish a connection. In other words, in the exemplary embodiment of FIG. 5, the signal S1 is the initial signal for establishing the connection between the host system and the memory storage device in the handshake stage. After the handshake stage is completed (i.e., after time point T1), a transmission stage (i.e., between time points T1 and T2) may be entered. In the transmission stages, the memory storage device may analyze a data signal from the host system by using the calibrated phase-locked loop circuits 12 and/or 22.

Figure 6:
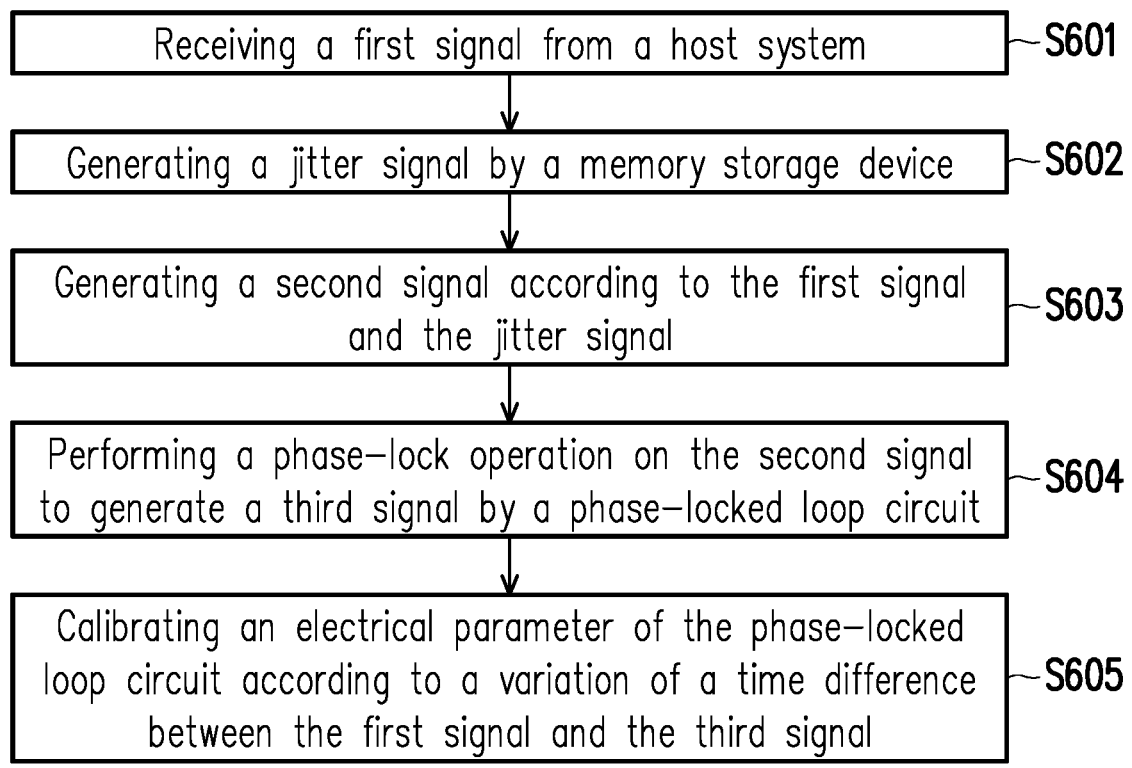
FIG. 6 is a flowchart illustrating a phase-locked loop circuit calibration method according to an exemplary embodiment of the disclosure.

FIG. 6 is a flowchart illustrating a phase-locked loop circuit calibration method according to an exemplary embodiment of the disclosure. Referring to FIG. 6, in step S601, a first signal is received from a host system. In step S602, a jitter signal is generated by a memory storage device. In step S603, a second signal is generated according to the first signal and the jitter signal. In step S604, a phase-lock operation is performed on the second signal to generate a third signal by a phase-locked loop circuit. In step S605, an electrical parameter of the phase-locked loop circuit is calibrated according to a variation of a time difference between the first signal and the third signal.

Nevertheless, steps depicted in FIG. 6 are described in detail as above so that related description thereof is omitted hereinafter. It should be noted that, the steps depicted in FIG. 6 may be implemented as a plurality of program codes or circuits, which are not particularly limited in the disclosure. Moreover, the method disclosed in FIG. 6 may be implemented by reference with above exemplary embodiments, or may be implemented separately, which are not particularly limited in the disclosure.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 7:
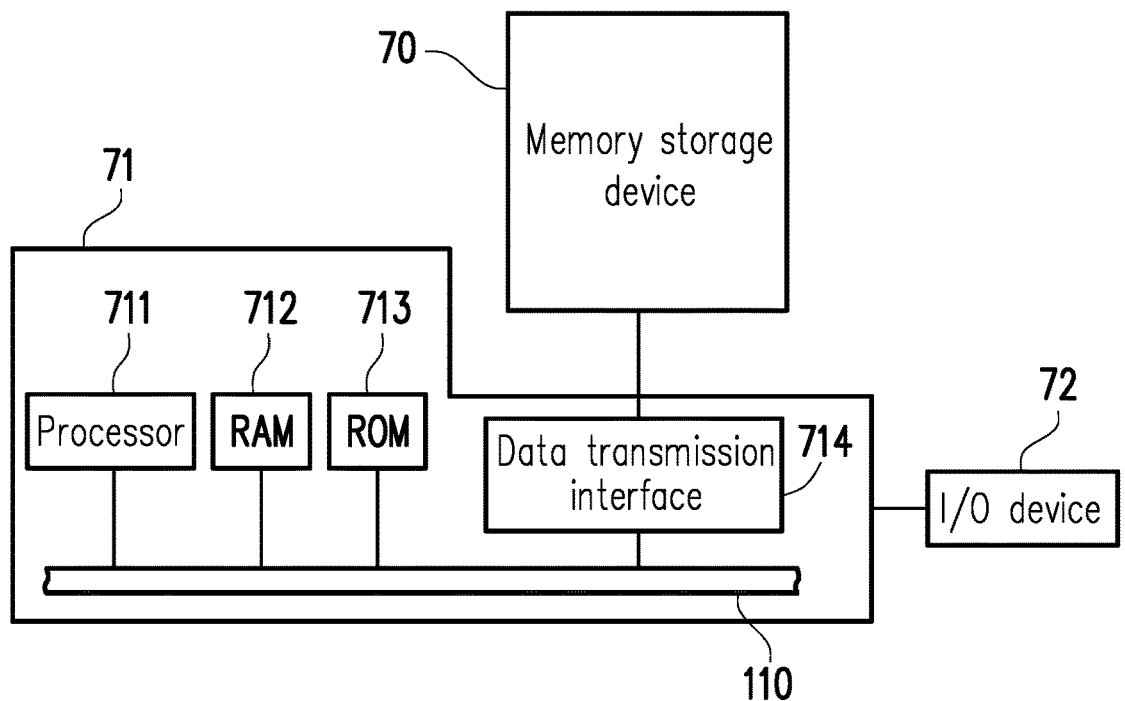
FIG. 7 is a schematic diagram illustrating a host system, a memory storage device and an I/O (input/output) device according to an exemplary embodiment of the disclosure.
Figure 8:
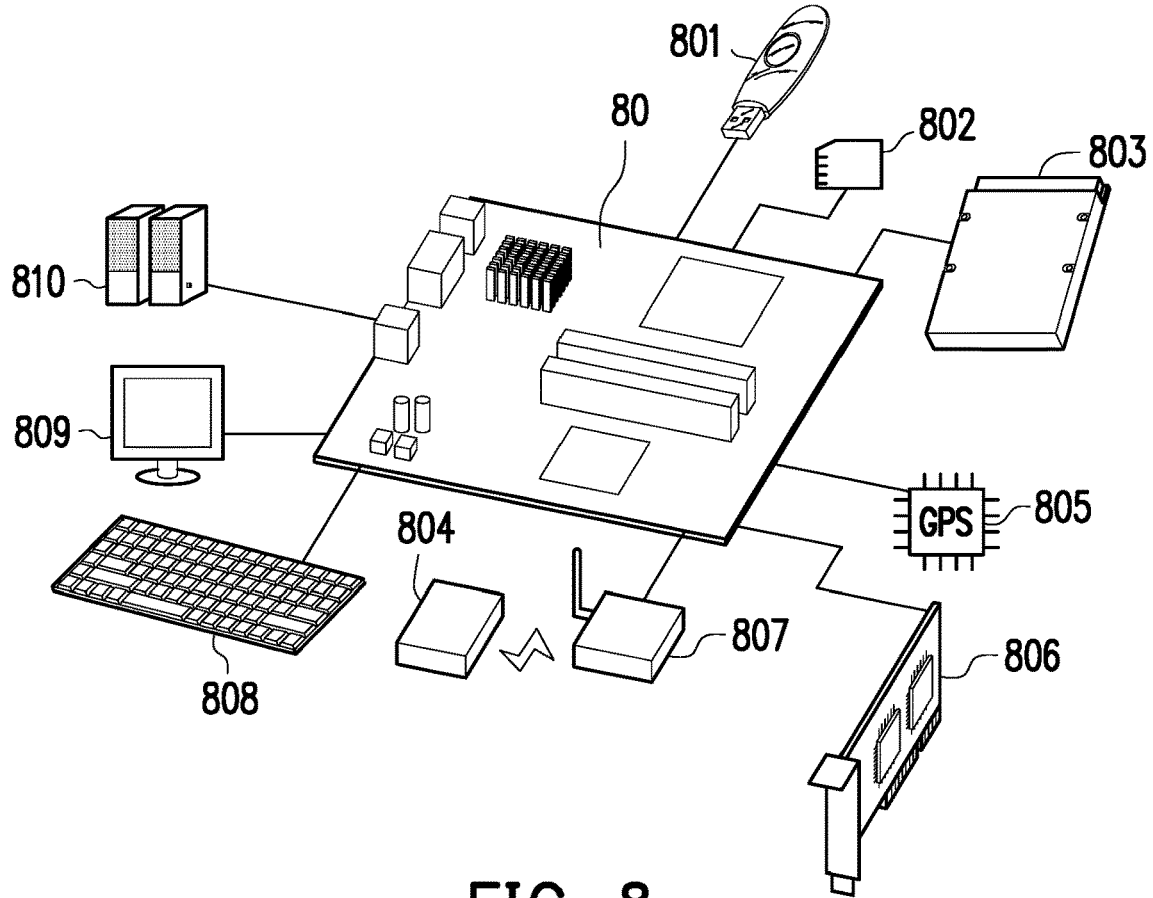
FIG. 8 is a schematic diagram illustrating a host system, a memory storage device and an I/O device according to another exemplary embodiment of the disclosure.

FIG. 7 is a schematic diagram illustrating a host system, a memory storage device and an I/O (input/output) device according to an exemplary embodiment of the disclosure. FIG. 8 is a schematic diagram illustrating a host system, a memory storage device and an I/O device according to another exemplary embodiment of the disclosure.

Referring to FIG. 7 and FIG. 8, a host system 71 generally includes a processor 711, a RAM (random access memory) 712, a ROM (read only memory) 713 and a data transmission interface 714. The processor 711, the RAM 712, the ROM 713 and the data transmission interface 714 are coupled to a system bus 710.

In this exemplary embodiment, the host system 71 is coupled to a memory storage device 70 through the data transmission interface 714. For example, the host system 71 can store data into the memory storage device 70 or read data from the memory storage device 70 via the data transmission interface 714. Further, the host system 71 is coupled to an I/O device 72 via the system bus 710. For example, the host system 71 can transmit output signals to the I/O device 72 or receive input signals from the I/O device 72 via the system bus 710.

In the present exemplary embodiment, the processor 711, the RAM 712, the ROM 713 and the data transmission interface 714 may be disposed on a main board 80 of the host system 71. The number of the data transmission interface 714 may be one or more. Through the data transmission interface 714, the main board 80 may be coupled to the memory storage device 70 in a wired manner or a wireless manner. The memory storage apparatus 70 may be, for example, a flash drive 801, a memory card 802, a SSD (Solid State Drive) 803 or a wireless memory storage apparatus 204. The wireless memory storage device 804 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 80 may also be coupled to various I/O devices including a GPS (Global Positioning System) module 805, a network interface card 806, a wireless transmission device 807, a keyboard 808, a monitor 809 and a speaker 810 through the system bus 710. For example, in an exemplary embodiment, the main board 80 can access the wireless memory storage device 804 via the wireless transmission device 807.

Figure 9:
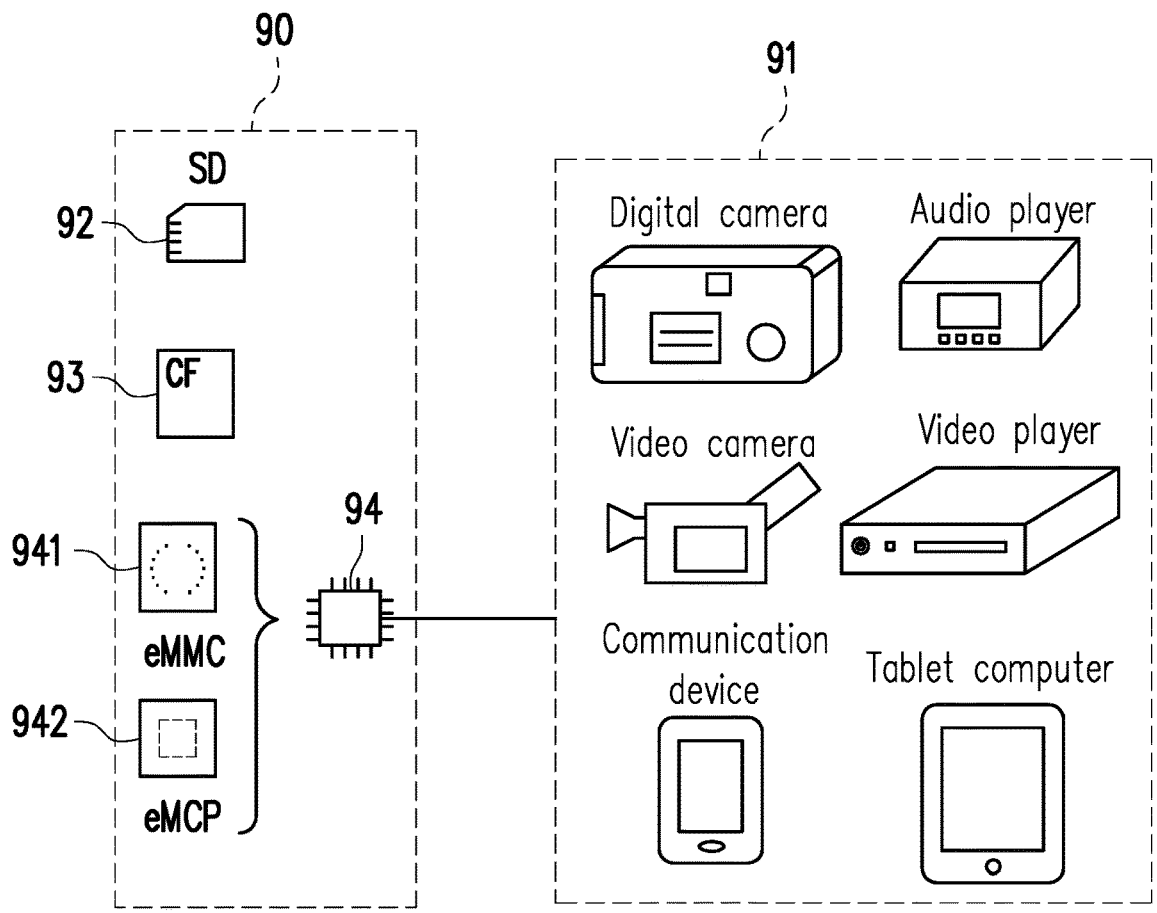
FIG. 9 is a schematic diagram illustrating a host system and a memory storage device according to another exemplary embodiment of the disclosure.

In an exemplary embodiment, aforementioned host system may be any system capable of substantially cooperating with the memory storage device for storing data. Although the host system is illustrated as a computer system in foregoing exemplary embodiment, nonetheless, FIG. 9 is a schematic diagram illustrating a host system and a memory storage device according to another exemplary embodiment of the disclosure. Referring to FIG. 9, in another exemplary embodiment, a host system 91 may also be a system such as a digital camera, a video camera, a communication device, an audio player, a video player or a tablet computer, whereas a memory storage device 90 may be various non-volatile memory storage devices used by the host system, such as a SD (Secure Digital) card 92, a CF (Compact Flash) card 93 or an embedded storage device 94. The embedded storage device 94 includes various embedded storage devices capable of directly coupling a memory module onto a substrate of the host system, such as an eMMC (embedded Multi Media Card) 941 and/or an eMCP (embedded Multi Chip Package) storage device 942.

Figure 10:
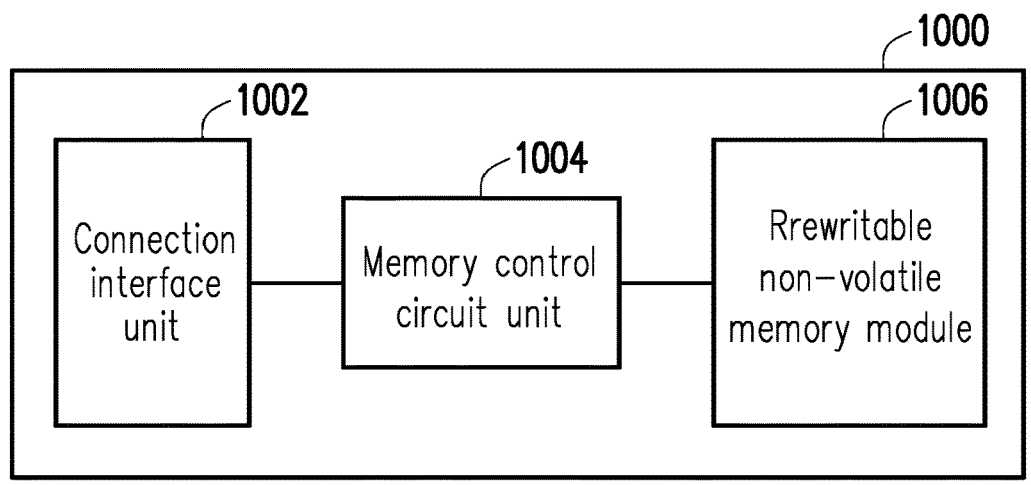
FIG. 10 is a schematic block diagram illustrating a memory storage device according to an exemplary embodiment of the disclosure.

FIG. 10 is a schematic block diagram illustrating a memory storage device according to an exemplary embodiment of the disclosure. Referring to FIG. 10, the memory storage device 1000 includes a connection interface unit 1002, a memory control circuit unit 1004 and a rewritable non-volatile memory module 1006. It should be noted that, the connection interface unit 1002 may include the connection interface circuit 10 in the exemplary embodiment of FIG. 1 or the connection interface circuit 20 in the exemplary embodiment of FIG. 2.

The connection interface unit 1002 is configured to couple to the memory storage device 1000 to the host system. In the present exemplary embodiment, the connection interface unit 1002 is compatible with a SATA (Serial Advanced Technology Attachment) standard. Nevertheless, it should be understood that the disclosure is not limited in this regard. The connection interface unit 1002 may also be compatible with a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a MCP interface standard, a MMC interface standard, an eMMC interface standard, a UFS (Universal Flash Storage) interface standard, an eMCP interface standard, a CF interface standard, an IDE (Integrated Device Electronics) interface standard or other suitable standards. The connection interface unit 1002 and the memory control circuit unit 1004 may be packaged into one chip, or the connection interface unit 1002 is distributed outside of a chip containing the memory control circuit unit 1004.

The memory control circuit unit 1004 is configured to execute a plurality of logic gates or control commands which are implemented in a hardware form or in a firmware form and perform operations of writing, reading or erasing data in the rewritable non-volatile memory storage module 1006 according to the commands of the host system.

The rewritable non-volatile memory module 1006 is coupled to the memory control circuit unit 1004 and configured to store data written from the host system 1000. The rewritable non-volatile memory module 1006 may be a SLC (Single Level Cell) NAND flash memory module (i.e., a flash memory module capable of storing one bit in one memory cell), an MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), a QLC (Quad Level Cell) NAND-type flash memory module (i.e., a flash memory module capable of storing four bits in one memory cell), other flash memory modules or other memory modules having the same features.

In the rewritable non-volatile memory module 1006, one or more bits are stored by changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This operation of changing the threshold voltage of the memory cell is also known as "writing data into the memory cell" or "programming the memory cell". With changes in the threshold voltage, each of the memory cells in the rewritable non-volatile memory module 406 has a plurality of storage states. The storage state to which the memory cell belongs may be determined by applying a read voltage to the memory cell, so as to obtain the one or more bits stored in the memory cell.

In the present exemplary embodiment, the memory cells of the rewritable non-volatile memory module 1006 constitute a plurality of physical programming units, and the physical programming units constitute a plurality of physical erasing units. Specifically, the memory cells on the same word line constitute one or more of the physical programming units. If each of the memory cells can store two or more bits, the physical programming units on the same word line can be at least classified into a lower physical programming unit and an upper physical programming unit. For instance, a least significant bit (LSB) of one memory cell belongs to the lower physical programming unit, and a most significant bit (MSB) of one memory cell belongs to the upper physical programming unit. Generally, in the MLC NAND flash memory, a writing speed of the lower physical programming unit is higher than a writing speed of the upper physical programming unit, and/or a reliability of the lower physical programming unit is higher than a reliability of the upper physical programming unit.

In this exemplary embodiment, the physical programming unit is the minimum unit for programming. That is, the physical programming unit is the minimum unit for writing data. For example, the physical programming unit is a physical page or a physical sector. If the physical programming unit is the physical page, these physical programming units usually include a data bit area and a redundancy bit area. The data bit area includes multiple physical sectors configured to store user data, and the redundant bit area is configured to store system data (e.g., management data such as the error correcting code). In this exemplary embodiment, the data bit area contains 32 physical sectors, and a size of each physical sector is 512 bytes (B). However, in other exemplary embodiments, the data bit area may also contain 8, 16 physical sectors or different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

In summary, after the first signal is received from the host system, the second signal may be generated according to the first signal and the jitter signal generated by the memory storage device. After the phase-lock operation is performed on the second signal to generate the third signal, the electrical parameter of the phase-locked loop circuit may be calibrated according to the variation of the time difference between the first signal and the third signal (e.g., the time offset range). As a result, a calibration efficiency for the electrical parameter of the phase-locked loop circuit may be improved.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A connection interface circuit for connecting a memory storage device to a host system, the connection interface circuit comprising:
    a calibration circuit, configured to provide a jitter signal;
    a jitter generation circuit, configured to receive a first signal from the host system and generate a second signal according to the first signal and the jitter signal; and
    a phase-locked loop circuit, coupled to the jitter generation circuit and the calibration circuit and configured to perform a phase-lock operation on the second signal to generate a third signal,
    wherein the calibration circuit is further configured to calibrate an electrical parameter of the phase-locked loop circuit according to a variation of a time difference between the first signal and the third signal, wherein the time difference comprises a first time difference and a second time difference, the first time difference is different from the second time difference, and the calibration circuit comprises:
    a jitter control circuit, configured to provide the jitter signal;
    a time to digit converter circuit, configured to detect the first time difference and the second time difference and generate a digital value according to the first time difference and the second time difference; and
    a control circuit, coupled to the jitter control circuit and the time to digit converter circuit and calibrating the electrical parameter of the phase-locked loop circuit according to the digital value.

2. The connection interface circuit according to claim 1, wherein a frequency of the jitter signal is not higher than a frequency of the first signal.

3. The connection interface circuit according to claim 1, wherein the operation that the calibration circuit calibrates the electrical parameter of the phase-locked loop circuit according to the variation of the time difference between the first signal and the third signal comprises:
    adjusting at least one circuit parameter of the phase-locked loop circuit to calibrate a loop bandwidth or a loop jitter peaking of the phase-locked loop circuit.

4. The connection interface circuit according to claim 3, wherein the operation that the calibration circuit adjusts the at least one circuit parameter of the phase-locked loop circuit comprises:
    adjusting at least one of a current, an impedance and a gain on a close loop path of the phase-locked loop circuit.

5. The connection interface circuit according to claim 1, wherein the digital value reflects a range of time offset caused by the jitter signal on the second signal.

6. The connection interface circuit according to claim 1, wherein the operation that the calibration circuit calibrates the electrical parameter of the phase-locked loop circuit according to the variation of the time difference between the first signal and the third signal comprises:
    setting a frequency of the jitter signal to a first frequency;
    after performing the phase-lock operation on the second signal generated according to the first signal and the jitter signal having the first frequency, comparing the first signal and the third signal to generate a first digital value;
    determining a target value according to the first digital value;
    setting the frequency of the jitter signal to a second frequency, wherein the second frequency is different from the first frequency;
    after performing the phase-lock operation on the second signal generated according to the first signal and the jitter signal having the second frequency, comparing the first signal and the third signal to generate a second digital value; and
    calibrating the electrical parameter of the phase-locked loop circuit according to the target value and the second target value.

7. The connection interface circuit according to claim 1, wherein the first signal is an initial signal for establishing a connection between the host system and the memory storage device in a handshake stage.

8. The connection interface circuit according to claim 1, wherein the first signal is a test signal for calibrating the phase-locked loop circuit in a test stage.

9. The connection interface circuit according to claim 1, wherein the jitter signal is configured to adjust the first signal so that at least one rising edge or at least one falling edge of a bitstream of the second signal has a different amount of time offset.

10. A memory storage device, comprising:
a connection interface unit, configured to couple to a host system;
a rewritable non-volatile memory module; and
a memory control circuit unit, coupled to the connection interface unit and the rewritable non-volatile memory module,
wherein the connection interface unit comprises a phase-locked loop circuit,
wherein the connection interface unit is configured to receive a first signal from the host system,
wherein the connection interface unit is further configured to generate a jitter signal,
wherein the connection interface unit is further configured to generate a second signal according to the first signal and the jitter signal,
wherein the phase-locked loop circuit is configured to perform a phase-lock operation on the second signal to generate a third signal,
wherein the connection interface unit is further configured to calibrate an electrical parameter of the phase-locked loop circuit according to a variation of a time difference between the first signal and the third signal, wherein the operation that the connection interface unit calibrates the electrical parameter of the phase-locked loop circuit according to the variation of the time difference between the first signal and the third signal comprises:
detecting a first time difference between the first signal and the third signal;
detecting a second time difference between the first signal and the third signal, wherein the first time difference is different from the second time difference;
generating a digital value according to the first time difference and the second time difference; and
calibrating the electrical parameter of the phase-locked loop circuit according to the digital value.

11. The memory storage device according to claim 10, wherein a frequency of the jitter signal is not higher than a frequency of the first signal.

12. The memory storage device according to claim 10, wherein the operation that the connection interface unit calibrates the electrical parameter of the phase-locked loop circuit according to the variation of the time difference between the first signal and the third signal comprises:
adjusting at least one circuit parameter of the phase-locked loop circuit to calibrate a loop bandwidth or a loop jitter peaking of the phase-locked loop circuit.

13. The memory storage device according to claim 12, wherein the operation that the connection interface unit adjusts the at least one circuit parameter of the phase-locked loop circuit comprises:
adjusting at least one of a current, an impedance and a gain on a close loop path of the phase-locked loop circuit.

14. The memory storage device according to claim 10, wherein the digital value reflects a time offset range caused by the jitter signal on the second signal.

15. The memory storage device according to claim 10, wherein the operation that the connection interface unit calibrates the electrical parameter of the phase-locked loop circuit according to the variation of the time difference between the first signal and the third signal comprises:
setting a frequency of the jitter signal to a first frequency;
after performing the phase-lock operation on the second signal generated according to the first signal and the jitter signal having the first frequency, comparing the first signal and the third signal to generate a first digital value;
determining a target value according to the first digital value;
setting the frequency of the jitter signal to a second frequency, wherein the second frequency is different from the first frequency;
after performing the phase-lock operation on the second signal generated according to the first signal and the jitter signal having the second frequency, comparing the first signal and the third signal to generate a second digital value; and
calibrating the electrical parameter of the phase-locked loop circuit according to the target value and the second target value.

16. The memory storage device according to claim 10, wherein the first signal is an initial signal for establishing a connection between the host system and the memory storage device in a handshake stage.

17. The memory storage device according to claim 10, wherein the first signal is a test signal for calibrating the phase-locked loop circuit in a test stage.

18. The memory storage device according to claim 10, wherein the jitter signal is configured to adjust the first signal so that at least one rising edge or at least one falling edge of a bitstream of the second signal has a different amount of time offset.

19. A phase-locked loop circuit calibration method for a memory storage device comprising a rewritable non-volatile memory module, the phase-locked loop circuit calibration method comprising:
receiving a first signal from a host system;
generating a jitter signal by the memory storage device;
generating a second signal according to the first signal and the jitter signal;
performing a phase-lock operation on the second signal to generate a third signal by a phase-locked loop circuit; and
calibrating an electrical parameter of the phase-locked loop circuit according to a variation of a time difference between the first signal and the third signal, wherein the step of calibrating the electrical parameter of the phase-locked loop circuit according to the variation of the time difference between the first signal and the third signal comprises:
detecting a first time difference between the first signal and the third signal;
detecting a second time difference between the first signal and the third signal, wherein the first time difference is different from the second time difference;
generating a digital value according to the first time difference and the second time difference; and
calibrating the electrical parameter of the phase-locked loop circuit according to the digital value.

20. The phase-locked loop circuit calibration method according to claim 19, wherein a frequency of the jitter signal is not higher than a frequency of the first signal.

21. The phase-locked loop circuit calibration method according to claim 19, wherein the step of calibrating the electrical parameter of the phase-locked loop circuit according to the variation of the time difference between the first signal and the third signal comprises:
adjusting at least one circuit parameter of the phase-locked loop circuit to calibrate a loop bandwidth or a loop jitter peaking of the phase-locked loop circuit.

22. The phase-locked loop circuit calibration method according to claim 21, wherein the step of adjusting the at least one circuit parameter of the phase-locked loop circuit comprises:

adjusting at least one of a current, an impedance and a gain on a close loop path of the phase-locked loop circuit.

23. The phase-locked loop circuit calibration method according to claim 19, wherein the digital value reflects a time offset range caused by the jitter signal on the second signal.

24. The phase-locked loop circuit calibration method according to claim 19, wherein the step of calibrating the electrical parameter of the phase-locked loop circuit according to the variation of the time difference between the first signal and the third signal comprises:

setting a frequency of the jitter signal to a first frequency;
after performing the phase-lock operation on the second signal generated according to the first signal and the jitter signal having the first frequency, comparing the first signal and the third signal to generate a first digital value;
determining a target value according to the first digital value;
setting the frequency of the jitter signal to a second frequency, wherein the second frequency is different from the first frequency;
after performing the phase-lock operation on the second signal generated according to the first signal and the jitter signal having the second frequency, comparing the first signal and the third signal to generate a second digital value; and
calibrating the electrical parameter of the phase-locked loop circuit according to the target value and the second target value.

25. The phase-locked loop circuit calibration method according to claim 19, wherein the first signal is an initial signal for establishing a connection between the host system and the memory storage device in a handshake stage.

26. The phase-locked loop circuit calibration method according to claim 19, wherein the first signal is a test signal for calibrating the phase-locked loop circuit in a test stage.

27. The phase-locked loop circuit calibration method according to claim 19, wherein the jitter signal is configured to adjust the first signal so that at least one rising edge or at least one falling edge of a bitstream of the second signal has a different amount of time offset.

* * * * *